US012732171B2

(12) United States Patent
Herberholz et al.

(10) Patent No.: US 12,732,171 B2
(45) Date of Patent: Sep. 8, 2026

(54) DROOP PROTECTION METHOD AND CIRCUIT

(71) Applicant: Arm Limited, Cambridge (GB)

(72) Inventors: Rainer Herberholz, Great Abington (GB); Amit Chhabra, Noida (IN)

(73) Assignee: Arm Limited, Cambridge (GB)

( * ) Notice: Subject to any disclaimer, the term of this patent is extended or adjusted under 35 U.S.C. 154(b) by 113 days.

(21) Appl. No.: 18/925,373

(22) Filed: Oct. 24, 2024

(65) Prior Publication Data

US 2025/0141436 A1 May 1, 2025

(30) Foreign Application Priority Data

Oct. 27, 2023 (IN) ............................. 202311073296
Mar. 20, 2024 (GB) ..................................... 2403976

(51) Int. Cl.
*H03K 5/00* (2006.01)
*G05F 1/46* (2006.01)
*G06F 1/30* (2006.01)
*H03L 7/08* (2006.01)

(52) U.S. Cl.
CPC ........... *H03K 5/00006* (2013.01); *G05F 1/46* (2013.01); *G06F 1/305* (2013.01); *H03L 7/08* (2013.01)

(58) Field of Classification Search
CPC ..... G05F 1/46; G06F 1/04; G06F 1/08; G06F 1/26; G06F 1/28; G06F 1/305; H03L 7/08; H03L 7/16; H03K 5/00006
See application file for complete search history.

(56) References Cited

U.S. PATENT DOCUMENTS 10,707,877 B1 * 7/2020 Majumder .............. H03L 7/099
10,790,838 B1 * 9/2020 Mosalikanti ............ H03L 7/085
2011/0215779 A1 * 9/2011 Lee ........................... G05F 1/10 323/282

OTHER PUBLICATIONS

Combined Search and Examination Report under Sections 17 and 18(3) for GB2403976.0 mailed Jan. 8, 2025.
Examination Report under Section 18(3) for GB Application No. GB2403976.0 dated Mar. 19, 2026.

* cited by examiner

*Primary Examiner* — Terrell S Johnson
(74) *Attorney, Agent, or Firm* — DeWitt LLP

(57) ABSTRACT

The present techniques relate to mitigating droop conditions over state transitions in systems having dynamic voltage and frequency scaling and there is disclosed a method of controlling a dynamic voltage and frequency scaling circuit, comprising: initiating a transition from a first voltage and frequency state to a second voltage and frequency state; switching activity from a first nominal source to a first fallback source; retuning the first nominal source to become a second fallback source at the second voltage and frequency state; switching activity from the first fallback source to the second fallback source; retuning the first fallback source to become a second nominal source at the second voltage and frequency state; and switching activity from the second fallback source to the second nominal source.

17 Claims, 6 Drawing Sheets

DROOP PROTECTION METHOD AND CIRCUIT

TECHNICAL FIELD

The present technology is directed to a method and electronic circuit for mitigating droop conditions over state transitions in systems having dynamic voltage and frequency scaling.

BACKGROUND OF THE DISCLOSURE

Some computer circuits (e.g. a central processor unit (CPU) or graphics processor unit (GPU)) may experience performance issues. For example, a CPU can generate voltage droops due to large changes in current required from a power delivery network (PDN).

There is a need for mitigation action to address such performance issues.

SUMMARY OF THE DISCLOSURE

The present techniques relate to addressing or mitigating such performance issues or improving known mitigation techniques.

In a first approach there is provided a method of method of controlling a dynamic voltage and frequency scaling circuit, comprising initiating a transition from a first voltage and frequency state to a second voltage and frequency state; switching activity from a first nominal source to a first fallback source; retuning the first nominal source to become a second fallback source at the second voltage and frequency state; switching activity from the first fallback source to the second fallback source; retuning the first fallback source to become a second nominal source at the second voltage and frequency state; and switching activity from the second fallback source to the second nominal source.

Prior to retuning the first nominal source, the method may comprise quiescing activity at the first nominal source.

The dynamic voltage and frequency scaling circuit may comprise a clock circuit. The first nominal source may comprise a first phase locked loop. The first fallback source may comprise a second phase locked loop.

The transition from a first voltage and frequency state to a second voltage and frequency state may comprise increasing voltage or frequency. Alternatively, the transition from a first voltage and frequency state to a second voltage and frequency state may comprise decreasing voltage or frequency.

Each of the first fallback source and the second fallback source may be set at a frequency level to provide droop mitigation. Each of the first fallback source and the second fallback source may be set at a voltage level to provide droop mitigation.

The method may further comprise: after switching activity from a first nominal source to a first fallback source, awaiting stability of the second fallback source at the second voltage and frequency state; and responsive to stability of the second fallback source at the second voltage and frequency state, switching activity from the first fallback source to the second fallback source.

The method may further comprise: after retuning the first fallback source to become a second nominal source at the second voltage and frequency state; awaiting stability of the second nominal source at the second voltage and frequency state; and responsive to stability of the second nominal source at the second voltage and frequency state, switching activity from the second fallback source to the second nominal source.

Initiating the transition may comprise initiating the transition responsive to a signal from software, such as an operating system or software.

In a second approach, there is provided an electronic circuit comprising electronic logic components operable to perform the steps of the method described above.

In a third approach, there is provided a non-transitory computer readable medium comprising a structure of data and imperatives operable to cause a device to construct a set of electronic logic components which, when embedded in an electronic device and activated thereon, cause the electronic device to perform the steps of the method described above.

In a fourth approach, there is provided a system comprising: the circuit described above, implemented in at least one packaged chip; at least one system component; and a board, wherein the at least one packaged chip and the at least one system component are assembled on the board.

In a fifth approach, there is provided a chip-containing product comprising the system described. assembled on a further board with at least one other product component.

In a sixth approach there is provided a non-transitory computer-readable medium to store computer-readable code for fabrication of the electronic circuit described above.

The method and circuit according to the present technology may thus be used in mitigating droop conditions over voltage and frequency state transitions in systems having dynamic voltage and frequency scaling, and that method may be realised in the form of a non-transitory computer readable medium comprising a structure of data and imperatives operable to cause a device to construct a set of electronic logic components which, when embedded in an electronic device and activated thereon, cause the electronic device to perform the steps of the method of the present technology as described hereinabove.

As will be clear to one of skill in the art, a hybrid approach may also be taken, in which hardware logic, firmware and/or software may be used in any combination to implement the present technology.

BRIEF DESCRIPTION OF THE DRAWINGS

Implementations of the disclosed technology will now be described, by way of example only, with reference to the accompanying drawings, in which.

DETAILED DESCRIPTION

Figure 1A:
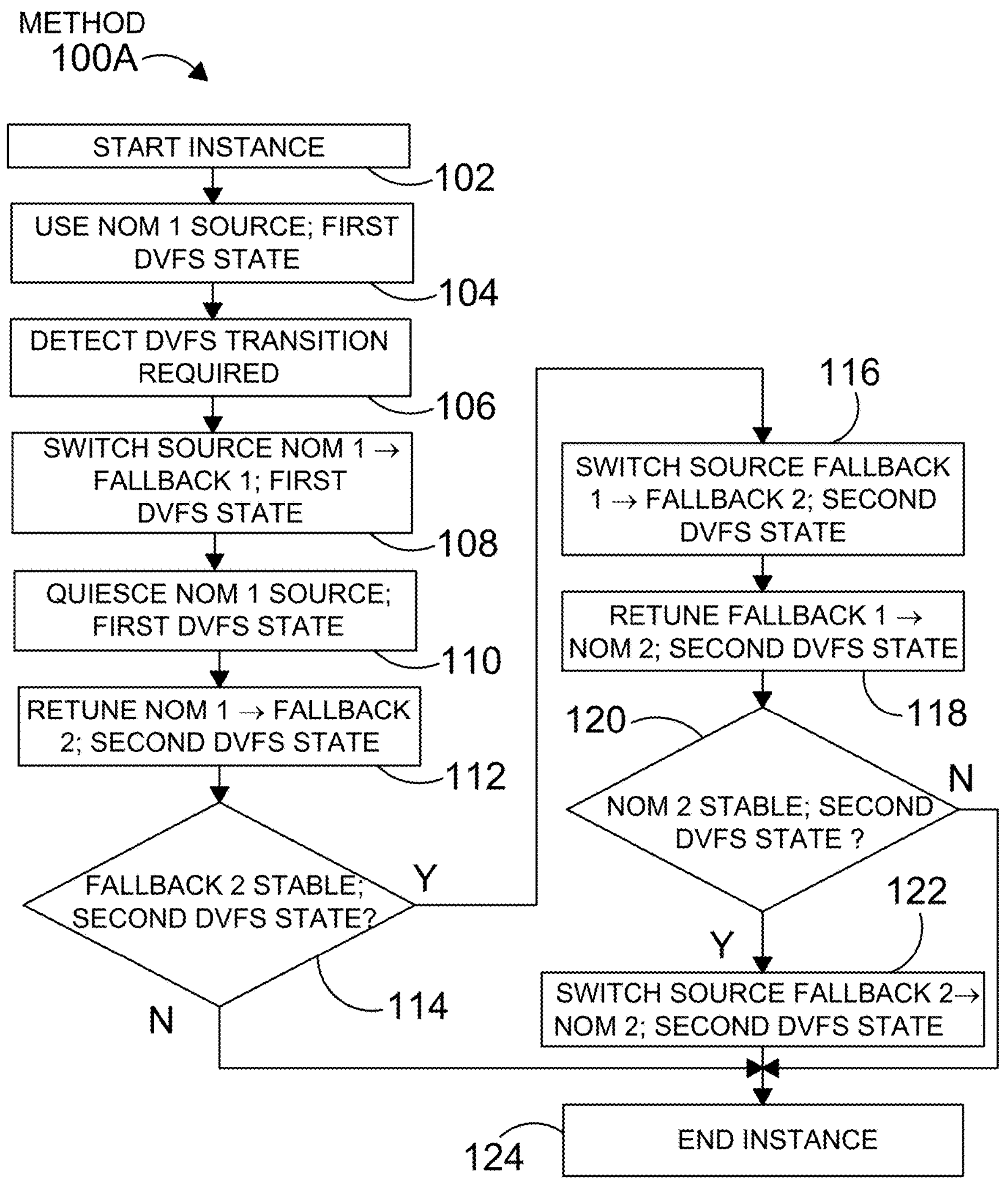
FIG. 1A shows a simplified example of a method of operation according to an implementation of the present technology.

In integrated circuits, a droop is a (usually) transient lowering of the voltage in a circuit. This is a well-known phenomenon and can happen because, for example, the power supply dips for some reason below a normal operating voltage of the circuit, because more current is drawn by the conductive elements than the normal current drawn, or because signal interference or noise on the power supply has caused a voltage fluctuation.

Droops can impact the operations of a circuit, for example by reducing the performance of the chip and thus leading to longer processing times. But there may be more serious effects also—for example, if the circuit draws more current to maintain the level of performance, this can lead to increased power consumption and the concomitant heat dissipation problems, which can lead to reduced life of the chip and in severe cases, a complete failure of the chip. Droops can also cause data corruption or errors in the output. This is a very serious issue for applications that depend on the accuracy and reliability of the chip, for example, in safety-critical applications, such as automotive or avionics systems.

The present techniques address some of the problems inherent in implementing a dynamic voltage and frequency scaling (DVFS) circuit in combination with a droop mitigation scheme. Use cases for the present technology may include, for example, systems in which it is necessary to maintain continuity of, for example, a clock out signal. Such systems may include, for example, systems needing failure resistance for safety reasons, such as automotive and avionics control systems, medical apparatus control systems and the like.

In a dynamic voltage and frequency scaling (DVFS) circuit, such as a clock circuit, having a droop mitigation scheme, a first clock source (for instance, PLL0) may provide a first clock called "NOM clock" and a second clock source (for instance, PLL1) provides a second clock called "FB clock". The frequency of the FB clock may be set lower than the frequency of "NOM clock," thus compensating for voltage droop effects by reducing the frequency of the clock pulses. The NOM (for "nominal") clock is normally used to drive the output clock. In case of a supply droop event, the FB (for "fallback") clock is used to drive the output clock as a droop mitigation technique.

The droop mitigation technique envisioned here is one in which a voltage droop is allowed for by providing the ability to reduce the frequency of the circuit's clock operation to match the reduced voltage resulting from the droop. This is achieved by providing a fallback frequency, typically by switching from the normal clock source (which may be referred to as the "nominal" clock) to a clock source with a lower frequency (which may be referred to as the "fallback" clock).

During a DVFS transition, the voltage level and clock frequency of the circuit may need to be adjusted to meet system power and speed requirements. The present technology provides a method and circuit operable to update both the NOM clock and FB clock in accordance with the new DVFS state, by retuning both the PLL0 and PLL1. The present technology addresses the problem of maintaining the droop mitigation technique during the entire DVFS transition, without significantly slowing the transition process.

Turning first to FIG. 1A, there is shown a simplified flow diagram of a method 100A of controlling a dynamic voltage and frequency scaling (DVFS) circuit according to one implementation of the present techniques. An instance of the method starts at 102, and at first, the circuit is operated 104 using an input NOM1 as the source. The voltage at NOM 1 may be supplied at a predetermined frequency, for example, in a clock circuit by a phase locked loop (PLL). At this stage, the circuit is operating in the first DVFS state. At 106, a signal is received (e.g. from software, such as an operating system (OS) or firmware)) to initiate a transition to a different DVFS state—for example, the voltage is to be increased or decreased according to the requirements of the circuit. At 108, the circuit is switched to use FALLBACK 1 as the source, instead of NOM 1. At this stage, the circuit is still operating in the first DVFS state. Activity from the NOM 1 source may be quiesced 110, still in the first DVFS state. At 112, the NOM 1 source is retuned to the new voltage and frequency required to provide droop protection at The second DVFS state, that is it is retuned to FALLBACK 2. At 114 it is determined whether FALLBACK 2 has become stable; if not the instance ends, and other actions (not detailed here) may be required, such as, for example, abandoning the attempt to transition into the second DVFS state for the time being. If it is determined at 114 that FALLBACK 2 has stabilised in the second DVFS state, at 116, the circuit is switched to use FALLBACK 2 instead of FALLBACK 1. At 118, FALLBACK 1 is retuned to become NOM 2 at the new nominal voltage and corresponding frequency in the second DVFS state.

At 120 it is determined whether NOM 2 has become stable; if not the instance ends, and other actions (not detailed here) may be required, such as, for example, abandoning the attempt to transition into the second DVFS state for the time being. If it is determined at 120 that FALLBACK 2 has stabilised in the second DVFS state, at 122, the circuit is switched to use NOM 2 instead of FALLBACK 2, with FALLBACK 2 reverting to the role of a fallback for protection of the circuit against the effects of a voltage droop. At 122, therefore, The second DVFS state is established at the new voltage and frequency, and this instance of the method 100 ends at 124. As will be immediately clear to one of ordinary skill in the art, this ending applies to a single instance of the method 100A, and in a real world scenario, multiple instances of the method 100 may be started at 102 and completed at 124.

As will be immediately clear to one of skill in the art, the DVFS transition may be in either direction.

Figure 1B:
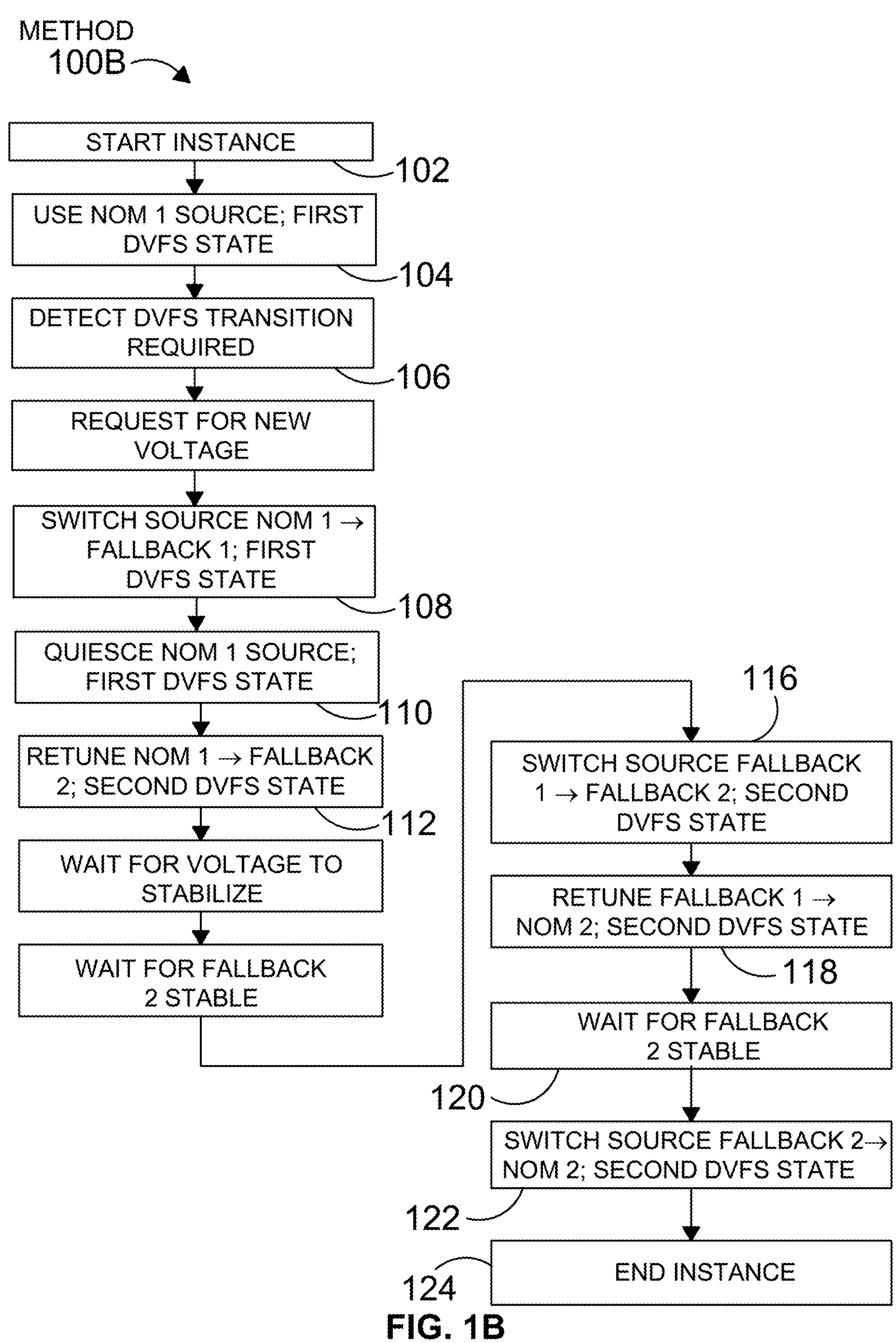
FIG. 1B shows one example of a method of DVFS transition to a higher voltage according to an implementation of the present technology.

FIG. 1B shows one example of a method 100B of DVFS transition to a higher voltage according to an implementation of the present technology. Like reference numbers in FIG. 1B refer to counterparts in FIG. 1A.

Figure 1C:
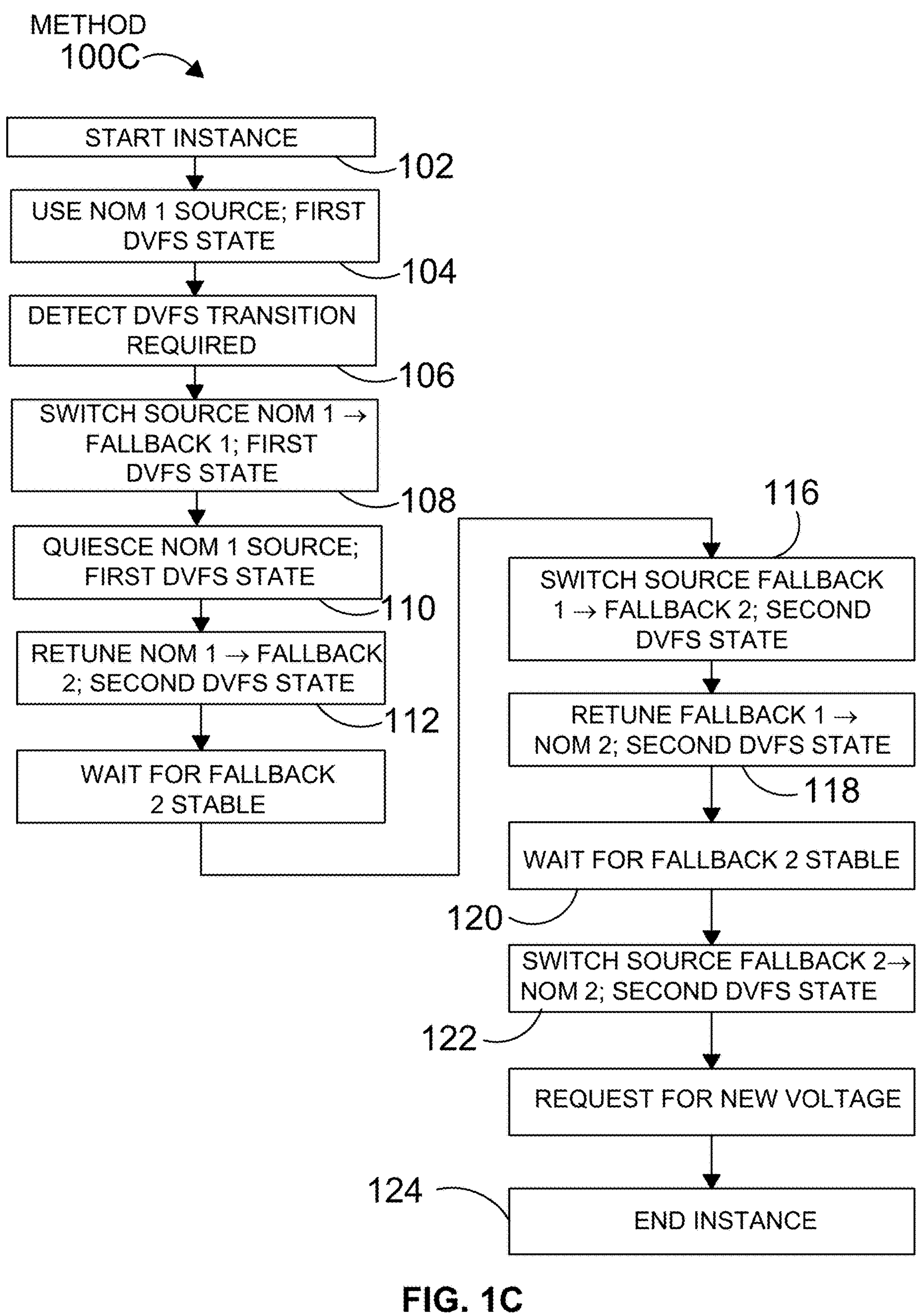
FIG. 1C shows one example of a method of DVFS transition to a lower voltage according to an implementation of the present technology.

FIG. 1C shows one example of a method of DVFS transition to a lower voltage according to an implementation of the present technology. Like reference numbers in FIG. 1C refer to counterparts in FIG. 1A.

Figure 2:
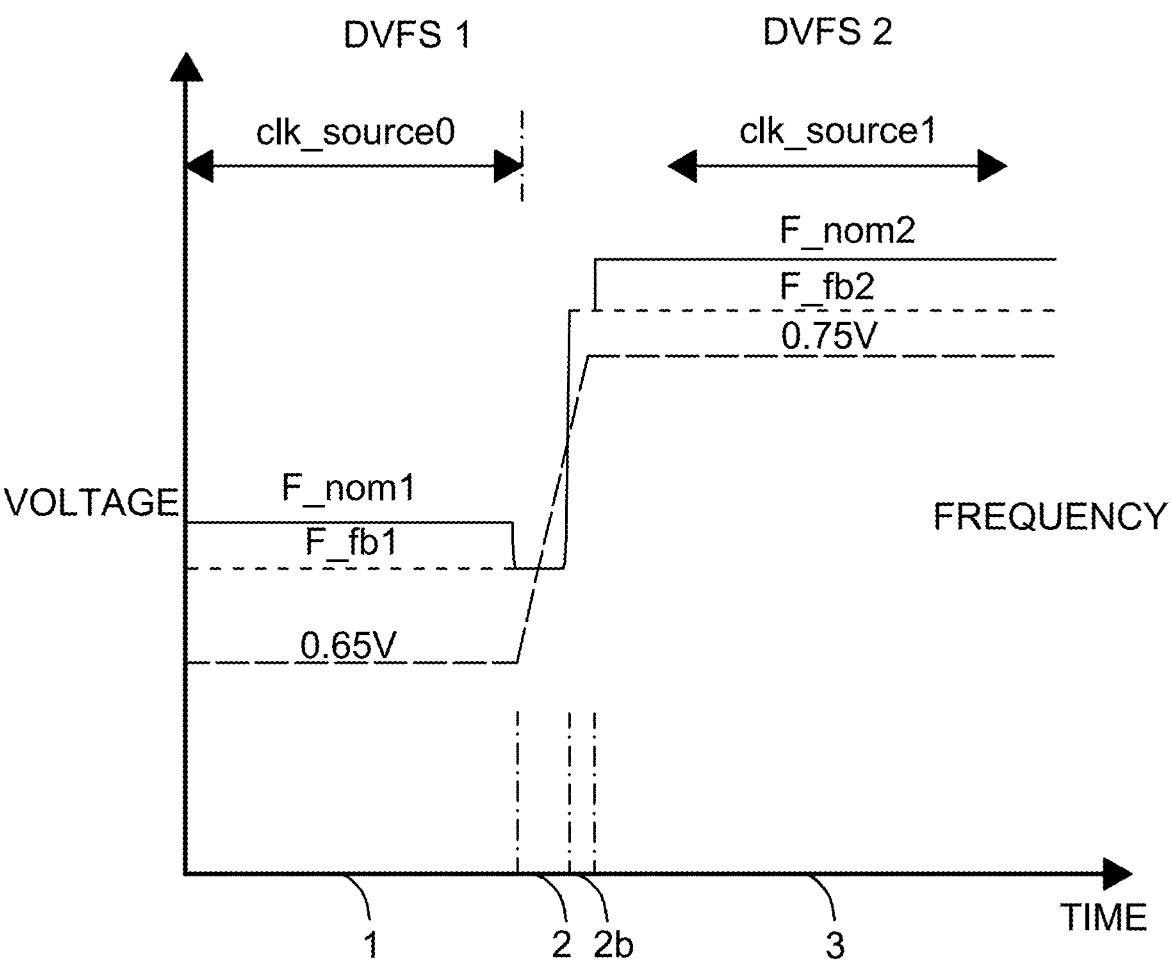
FIG. 2 shows a voltage-frequency graph over time to give a simple example of an input voltage transition according to an implementation of the present technology.

With reference now to FIG. 2, there is shown a voltage-frequency graph over time to give a simple example of an input voltage transition according to an implementation of the present technology.

FIG. 2 shows one example of the voltage and frequency behaviour of a system operable according to an implementation of the present techniques. The system is operable as follows. At time (1), the circuit is in DVFS mode 1 (DVFS 1). clk_source0 is tuned to the nominal frequency F_nom1 and is providing the normal output signal. clk_source1 is tuned to operate at fallback FB frequency F_fb1, ready to operate if a droop condition is detected. In the present example, the initial voltage is set at e.g. 0.65V. After any existing droop event has been mitigated, and the output clock is steadily driven by the nominal NOM clock, the system is instructed to transition to a new DVFS state and the method proceeds to the next step.

At time 2), the transition to the DVFS mode 2 (DVFS 2) begins. In DVFS 2, it is required that the NOM frequency=F_nom2 and the FB frequency=F_fb2. In addition, the voltage is set to a different value.

In the example shown in the figure, the new value is assumed to be a higher value than the voltage of DVFS 1. However, transitions in the other direction are also accommodated within the scope of the method according to the present technology.

At time 2), The clock frequency drops to the existing fallback FB frequency F_fb1 irrespective of any droop event. The present technology always operates within the droop mitigation scheme. Since there is no role for clk_source0 now, it is now free to be retuned to the new fallback frequency F_fb2. clk_source0, which was driving the nominal frequency F_nom1 is now tuned to drive the new fallback frequency, i.e., F_fb2.

At time 2*b*), clk_source0 has been locked to the new fallback frequency, F_fb2. Additionally, the voltage has been stabilized to the new target value. At that point, the output is driven by clk_source0 with frequency F_fb2. This new frequency is still the fallback frequency of the target DVFS point DVFS2. Hence, the system is still operating under droop mitigation.

After the switch to F_fb2 has been completed and stabilised for clk_source0, clk_source1 is now free and is retuned to the target nominal frequency, i.e., F_nom2.

Subsequently, at time 3), clk_source1 has locked to the F_nom2 as required under the mode DVFS 2. By time 3), both clk_source0 and clk_source1 have been retuned or set to the new F_fb2 and F_nom2, respectively, as required under the second DVFS mode DVFS 2. At this point, the output is switched back to F_nom2 and droop mitigation using F_fb2 proceeds.

The process is repeated when entering any subsequent DVFS mode. In the method and circuit according to the present technology, the source, which may, for example, be a PLL providing the nominal frequency will alternate between clk_source0 and clk_source1 on the transitions between DVFS modes.

Figure 3:
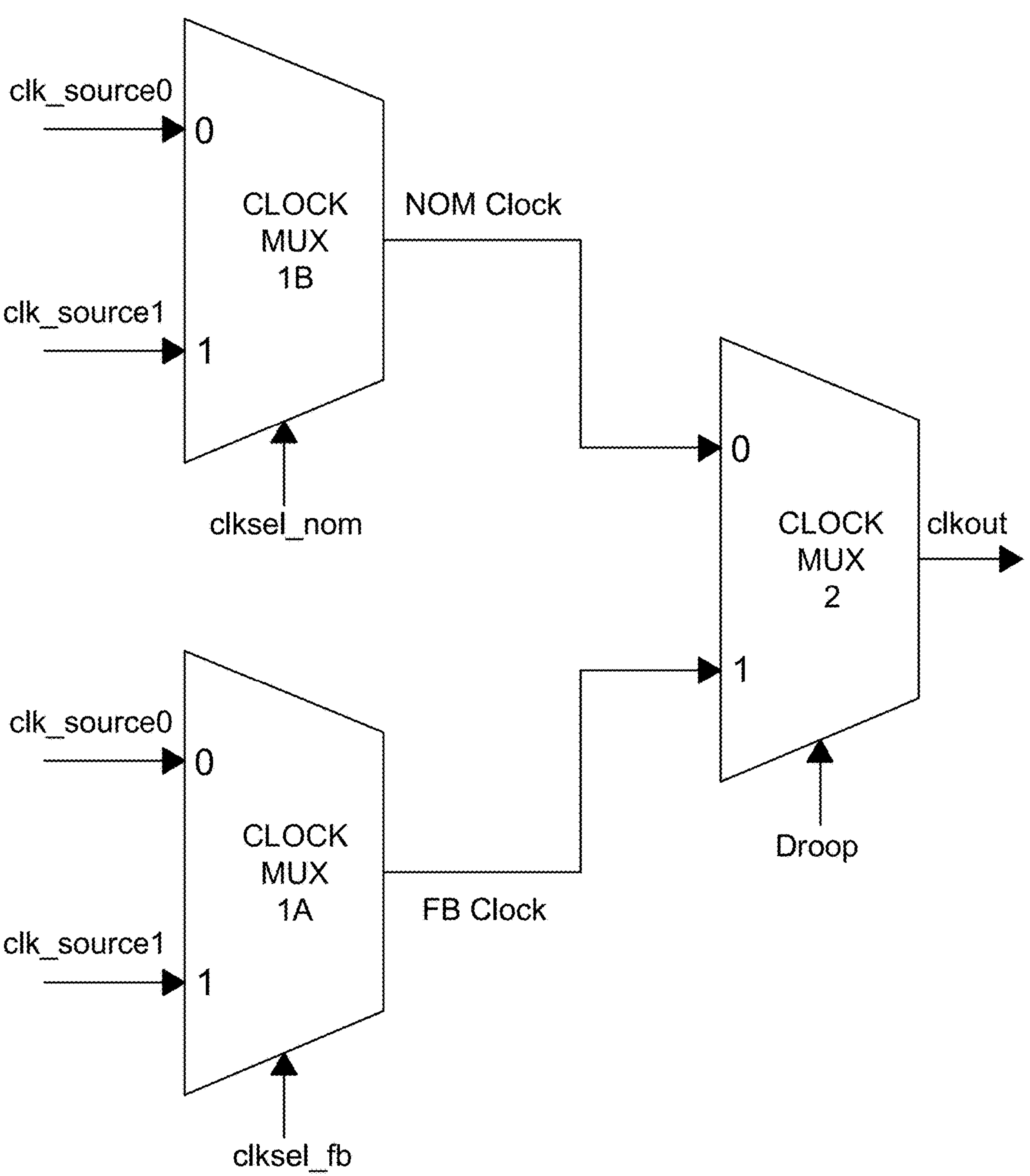
FIG. 3 shows a simple example of a multiplex arrangement according to an implementation of the present technology.

FIG. 3 shows one possible structure of multiplexers operable to implement the source selection process of the present technology in hardware. The first stage of clock mux is a pair of clock multiplexers CLOCK MUX 1A and CLOCK MUX 1B. Both CLOCK MUX 1A and CLOCK MUX 1B receive clock signals from both clock sources "clk_source0" and "clk_source1". The control signal for CLOCK MUX 1A is "clksel_nom" and the control signal for CLOCK MUX 1B is "clksel_fb". CLOCK MUX 1A always drives the "NOM clock" signal as its output. CLOCK MUX 1B always drives the "FB clock" signal. CLOCK MUX 2 is the droop mitigation multiplexer, which takes as inputs NOM clock and FB clock and is controlled by the "droop" signal. As discussed above with reference to the method of operation according to the present technology, the NOM clock source alternates between clk_source0 and clk_source1 in successive different DFVS modes.

There is thus provided a method of operation, an electronic circuit, and a non-transitory computer readable medium comprising data and imperatives, each according to an aspect of the present technology. The method provides a process for controlling a dynamic voltage and frequency scaling circuit, comprising: initiating, responsive to a signal, a transition from a first voltage and frequency state to a second voltage and frequency state; switching activity from a first nominal source to a first fallback source; retuning the first nominal source to become a second fallback source at the second voltage and frequency state; awaiting stability of the second fallback source at the second voltage and frequency state; responsive to stability of the second fallback source at the second voltage and frequency state, switching activity from the first fallback source to the second fallback source; retuning the first fallback source to become a second nominal source at the second voltage and frequency state; awaiting stability of the second nominal source at the second voltage and frequency state; and responsive to stability of the second nominal source at the second voltage and frequency state, switching activity from the second fallback source to the second nominal source.

The method may further comprise, prior to retuning the first nominal source, quiescing activity at the first nominal source. The dynamic voltage and frequency scaling circuit may comprise a clock circuit. The first nominal source may comprise a first phase locked loop. The first fallback source may comprise a second phase locked loop. The transition from a first voltage and frequency state to a second voltage and frequency state may comprise increasing or decreasing voltage or frequency. Each of the first fallback source and the second fallback source may be set at a frequency level to provide droop mitigation. Each of the first fallback source and the second fallback source may be set at a voltage level to provide droop mitigation.

Figure 4:
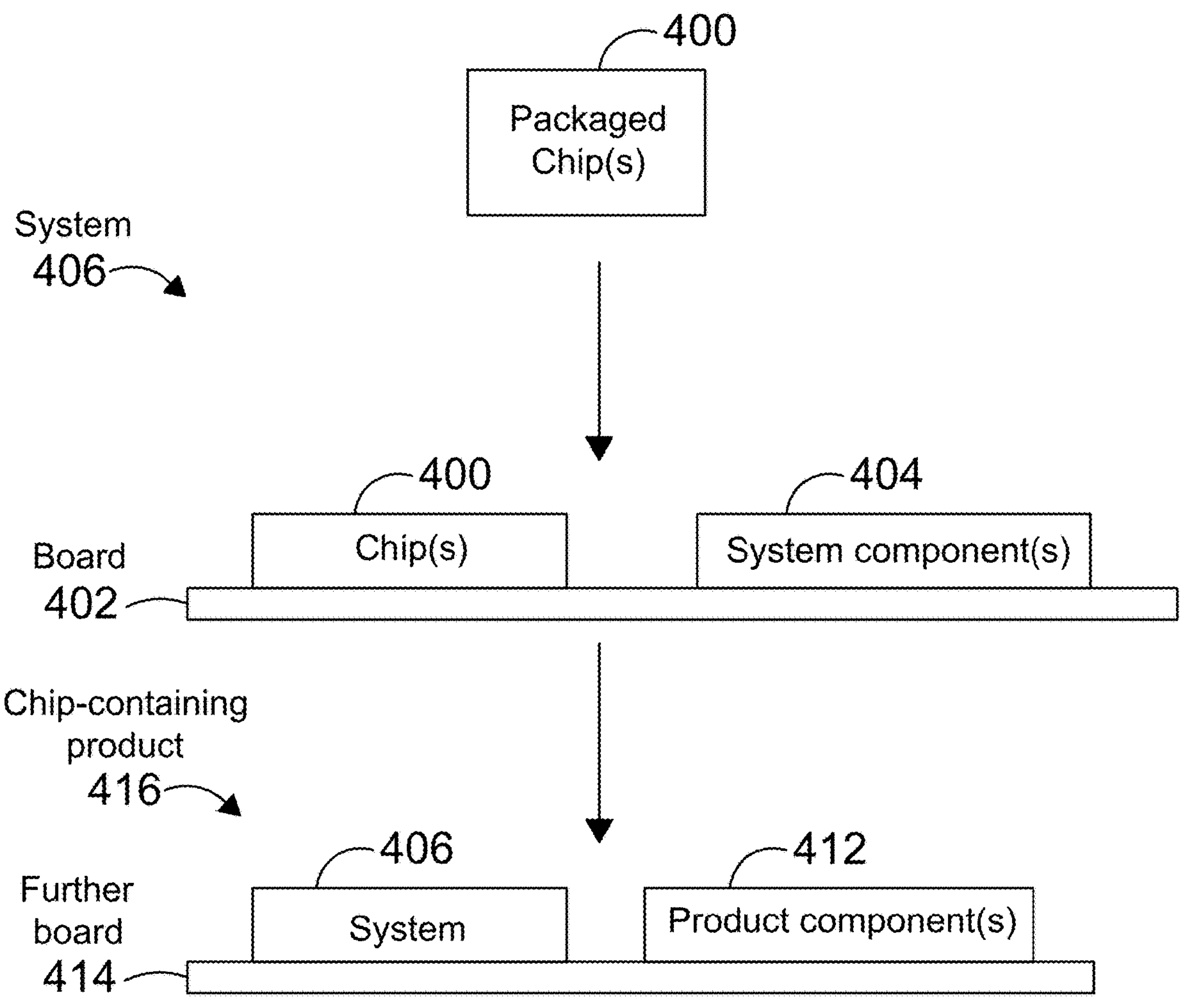
FIG. 4 illustrates a system and a chip-containing product.

As shown in FIG. 4, one or more packaged chips 400, with the circuitry described above implemented on one chip or distributed over two or more of the chips, are manufactured by a semiconductor chip manufacturer. In some examples, the chip product 400 made by the semiconductor chip manufacturer may be provided as a semiconductor package which comprises a protective casing (e.g. made of metal, plastic, glass or ceramic) containing the semiconductor devices implementing the circuitry described above and connectors, such as lands, balls or pins, for connecting the semiconductor devices to an external environment. Where more than one chip 400 is provided, these could be provided as separate integrated circuits (provided as separate packages), or could be packaged by the semiconductor provider into a multi-chip semiconductor package (e.g. using an interposer, or by using three-dimensional integration to provide a multi-layer chip product comprising two or more vertically stacked integrated circuit layers).

In some examples, a collection of chiplets (i.e. small modular chips with particular functionality) may itself be referred to as a chip. A chiplet may be packaged individually in a semiconductor package and/or together with other chiplets into a multi-chiplet semiconductor package (e.g. using an interposer, or by using three-dimensional integration to provide a multi-layer chiplet product comprising two or more vertically stacked integrated circuit layers).

The one or more packaged chips 400 are assembled on a board 402 together with at least one system component 404 to provide a system 406. For example, the board may comprise a printed circuit board. The board substrate may be made of any of a variety of materials, e.g. plastic, glass, ceramic, or a flexible substrate material such as paper, plastic or textile material. The at least one system component 404 comprise one or more external components which are not part of the one or more packaged chip(s) 400. For example, the at least one system component 404 could include, for example, any one or more of the following: another packaged chip (e.g. provided by a different manufacturer or produced on a different process node), an interface module, a resistor, a capacitor, an inductor, a transformer, a diode, a transistor and/or a sensor.

A chip-containing product 416 is manufactured comprising the system 406 (including the board 402, the one or more chips 400 and the at least one system component 404) and one or more product components 412. The product components 412 comprise one or more further components which are not part of the system 406. As a non-exhaustive list of examples, the one or more product components 412 could include a user input/output device such as a keypad, touch screen, microphone, loudspeaker, display screen, haptic device, etc.; a wireless communication transmitter/receiver; a sensor; an actuator for actuating mechanical motion; a thermal control device; a further packaged chip; an interface module; a resistor; a capacitor; an inductor; a transformer; a diode; and/or a transistor. The system 406 and one or more product components 412 may be assembled on to a further board 414.

The board 402 or the further board 414 may be provided on or within a device housing or other structural support (e.g. a frame or blade) to provide a product which can be handled by a user and/or is intended for operational use by a person or company.

The system 406 or the chip-containing product 416 may be at least one of: an end-user product, a machine, a medical device, a computing or telecommunications infrastructure product, or an automation control system. For example, as a non-exhaustive list of examples, the chip-containing product could be any of the following: a telecommunications device, a mobile phone, a tablet, a laptop, a computer, a server (e.g. a rack server or blade server), an infrastructure device, networking equipment, a vehicle or other automotive product, industrial machinery, consumer device, smart card, credit card, smart glasses, avionics device, robotics device, camera, television, smart television, DVD players, set top box, wearable device, domestic appliance, smart meter, medical device, heating/lighting control device, sensor, and/or a control system for controlling public infrastructure equipment such as smart motorway or traffic lights.

As will be appreciated by one skilled in the art, the present technology may be embodied as a method, a circuit or a computer readable medium comprising data and imperatives to cause construction of a circuit. Accordingly, the present techniques may take the form of an entirely hardware embodiment, an entirely software embodiment, or an embodiment combining software and hardware. Where the word "component" is used, it will be understood by one of ordinary skill in the art to refer to any portion of any of the above embodiments.

Concepts described herein may be embodied in computer-readable code for fabrication of an apparatus that embodies the described concepts. For example, the computer-readable code can be used at one or more stages of a semiconductor design and fabrication process, including an electronic design automation (EDA) stage, to fabricate an integrated circuit comprising the apparatus embodying the concepts. The above computer-readable code may additionally or alternatively enable the definition, modelling, simulation, verification and/or testing of an apparatus embodying the concepts described herein.

For example, the computer-readable code for fabrication of an apparatus embodying the concepts described herein can be embodied in code defining a hardware description language (HDL) representation of the concepts. For example, the code may define a register-transfer-level (RTL) abstraction of one or more logic circuits for defining an apparatus embodying the concepts. The code may define a HDL representation of the one or more logic circuits embodying the apparatus in Verilog, SystemVerilog, Chisel, or VHDL (Very High-Speed Integrated Circuit Hardware Description Language) as well as intermediate representations such as FIRRTL. Computer-readable code may provide definitions embodying the concept using system-level modelling languages such as SystemC and SystemVerilog or other behavioural representations of the concepts that can be interpreted by a computer to enable simulation, functional and/or formal verification, and testing of the concepts.

Additionally or alternatively, the computer-readable code may define a low-level description of integrated circuit components that embody concepts described herein, such as one or more netlists or integrated circuit layout definitions, including representations such as GDSII. The one or more netlists or other computer-readable representation of integrated circuit components may be generated by applying one or more logic synthesis processes to an RTL representation to generate definitions for use in fabrication of an apparatus embodying the invention. Alternatively or additionally, the one or more logic synthesis processes can generate from the computer-readable code a bitstream to be loaded into a field programmable gate array (FPGA) to configure the FPGA to embody the described concepts. The FPGA may be deployed for the purposes of verification and test of the concepts prior to fabrication in an integrated circuit or the FPGA may be deployed in a product directly.

The computer-readable code may comprise a mix of code representations for fabrication of an apparatus, for example including a mix of one or more of an RTL representation, a netlist representation, or another computer-readable definition to be used in a semiconductor design and fabrication process to fabricate an apparatus embodying the invention. Alternatively or additionally, the concept may be defined in a combination of a computer-readable definition to be used in a semiconductor design and fabrication process to fabricate an apparatus and computer-readable code defining instructions which are to be executed by the defined apparatus once fabricated.

Such computer-readable code can be disposed in any known transitory computer-readable medium (such as wired or wireless transmission of code over a network) or non-transitory computer-readable medium such as semiconductor, magnetic disk, or optical disc. An integrated circuit fabricated using the computer-readable code may comprise components such as one or more of a central processing unit, graphics processing unit, neural processing unit, digital signal processor or other components that individually or collectively embody the concept.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

In the present application, lists of features preceded with the phrase "at least one of" mean that any one or more of those features can be provided either individually or in combination. For example, "at least one of: [A], [B] and [C]" encompasses any of the following options: A alone (without B or C), B alone (without A or C), C alone (without A or B), A and B in combination (without C), A and C in combination (without B), B and C in combination (without A), or A, B and C in combination.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope of the invention as defined by the appended claims.

The invention claimed is:

1. A method of controlling a dynamic voltage and frequency scaling circuit, comprising:

initiating a transition from a first voltage and frequency state to a second voltage and frequency state;

switching activity from a first nominal source to a first fallback source;

retuning the first nominal source to become a second fallback source at the second voltage and frequency state;

switching activity from the first fallback source to the second fallback source;

retuning the first fallback source to become a second nominal source at the second voltage and frequency state; and switching activity from the second fallback source to the second nominal source.

2. The method according to claim 1, further comprising, prior to retuning the first nominal source, quiescing activity at the first nominal source.

3. The method according to claim 1, wherein the dynamic voltage and frequency scaling circuit comprises a clock circuit.

4. The method according to claim 3, wherein the first nominal source comprises a first phase locked loop.

5. The method according to claim 3, wherein the first fallback source comprises a second phase locked loop.

6. The method according to claim 1, wherein the transition from a first voltage and frequency state to a second voltage and frequency state comprises increasing voltage or frequency.

7. The method according to claim 1, wherein the transition from a first voltage and frequency state to a second voltage and frequency state comprises decreasing voltage or frequency.

8. The method according to claim 1, wherein each of the first fallback source and the second fallback source is set at a frequency level to provide droop mitigation.

9. The method according to claim 1, wherein each of the first fallback source and the second fallback source is set at a voltage level to provide droop mitigation.

10. The method according to claim 1, further comprising:

after switching activity from a first nominal source to a first fallback source, awaiting stability of the second fallback source at the second voltage and frequency state; and responsive to stability of the second fallback source at the second voltage and frequency state, switching activity from the first fallback source to the second fallback source.

11. The method according to claim 1, further comprising:

after retuning the first fallback source to become a second nominal source at the second voltage and frequency state;

awaiting stability of the second nominal source at the second voltage and frequency state; and responsive to stability of the second nominal source at the second voltage and frequency state, switching activity from the second fallback source to the second nominal source.

12. The method according to claim 1, wherein initiating the transition comprises: initiating the transition responsive to a signal from software.

13. An electronic circuit comprising electronic logic components operable to perform the method according to claim 1.

14. A non-transitory computer readable medium comprising a structure of data and imperatives operable to cause a device to construct a set of electronic logic components which, when embedded in an electronic device and activated thereon, cause the electronic device to perform the steps of the method according to claim 1.

15. A system comprising:

the circuit of claim 13, implemented in at least one packaged chip;

at least one system component; and a board, wherein the at least one packaged chip and the at least one system component are assembled on the board.

16. A chip-containing product comprising the system of claim 15 assembled on a further board with at least one other product component.

17. A non-transitory computer-readable medium to store computer-readable code for fabrication of the electronic circuit of claim 13.

* * * * *